United States Patent
Tseng

[11] Patent Number: 5,817,554
[45] Date of Patent: Oct. 6, 1998

[54] USE OF A GRATED TOP SURFACE TOPOGRAPHY FOR CAPACITOR STRUCTURES

[75] Inventor: Horng-Huei Tseng, Hsinchu, Taiwan

[73] Assignee: Vanguard International Semiconductor Corporation, Hsin-Chu, Taiwan

[21] Appl. No.: 813,723

[22] Filed: Mar. 7, 1997

[51] Int. Cl.⁶ .............................................. H01L 21/8242
[52] U.S. Cl. ........................ 438/253; 438/255; 438/398
[58] Field of Search .................... 438/238, 239, 438/253, 254, 255, 296–298; 257/309

[56] References Cited

U.S. PATENT DOCUMENTS

| | | | |
|---|---|---|---|
| 5,254,503 | 10/1993 | Kenney | 437/228 |
| 5,302,540 | 4/1994 | Ko et al. | 437/47 |
| 5,342,800 | 8/1994 | Jun | 437/52 |
| 5,358,888 | 10/1994 | Ahn et al. | 438/398 |
| 5,492,848 | 2/1996 | Lur et al. | 437/52 |

OTHER PUBLICATIONS

Watanabe et al, "Hemispherical Gran Silicon for High Density DRAMs", Solid State Technology, Jul. 1992, pp. 29–33.

*Primary Examiner*—Joni Chang
*Attorney, Agent, or Firm*—George O. Saile; Stephen B. Ackerman

[57] ABSTRACT

A method of creating an STC structure, used for high density, DRAM designs, has been developed. The process consists of creating a grated, top surface topography, in a polysilicon layer, that is used for polysilicon storage node electrode formation. The grated, top surface topography is obtained by anisotropic etching of the polysilicon layer, exposed between masking silicon oxide spots. The silicon oxide spots had been obtained via oxidation of small diameter, HSG polysilicon spots. The resulting grated, top surface topography, is comprised of raised, unetched features, and lower, etched features, in the polysilicon layer, used for the storage node electrode, increasing capacitor surface area, and thus increasing DRAM capacitance.

23 Claims, 4 Drawing Sheets

USE OF A GRATED TOP SURFACE TOPOGRAPHY FOR CAPACITOR STRUCTURES

BACKGROUND OF THE INVENTION (1) Field of the Invention

The present invention relates to a method used to fabricate high density, semiconductor, DRAM cells, and more specifically to a process used to increase the surface area, and the accompanying capacitance of In STC component of the DRAM cell, via the use of a storage node electrode configuration, featuring a grated, top surface topography.

(2) Description of the Prior Art

While the semiconductor industry is continually improving device performance, the cost of semiconductor chips have been maintained, or in some cases reduced. These objectives, performance and cost, have been achieved by the ability of the semiconductor industry to produce chips with sub-micron features, or micro-miniaturization. Sub-micron features allow the reduction in performance degrading capacitances and resistances to be realized. In addition the smaller features result in a smaller chip, however still possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller, or sub-micron features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 16 million cells per chip, or greater, has resulted in a specific cell in which a smaller transfer gate transistor is being used, resulting in less of an overlying area for placement of overlying STC structures.

One method of maintaining, or increasing STC capacitance, while still decreasing the lateral dimension of the capacitor, has been the use of rough, or hemispherical grained, (HSG), polysilicon layers. Watanabe, et al, in "Hemispherical Grain Silicon for High Density DRAMS", appearing in Solid State Technology, July, 1992, pages 29–33, describes a process for increasing the surface area of a storage node electrode by forming a continuous layer of hemispherical grain, (HSG), silicon on an underlying polysilicon structure, used for DRAM capacitors. The Watanabe, et al process, although resulting in increased surface area, has the level of increased surface area limited by the height, or roughness of the HSG grains, which can be difficult to control and reproduce. Another process for increasing the surface area of a storage node electrode, via the use of an HSG process is shown by C. Y. Lu, in an invention disclosure, VIS85–111, (serial No. 08-734061, filed Oct. 18, 1996). This invention, also describes the use of HSG, but in this case discontinuous spots of HSG are used as a mask to transfer the small diameter feature of the HSG spots, to an underlying silicon oxide layer. The small diameter features, now in the form of silicon oxide spots, are then used as a mask to allow etching of an underlying polysilicon layer, exposed between silicon oxide spots, to occur, resulting in a top surface of polysilicon exhibiting increased surface area. This method allows the level of surface area increases to be controlled by the depth of etching into the underlying polysilicon layer, used for the storage node electrode. However this invention, although resulting in increased storage node surface areas, is complex, involving transferring the HSG spot feature to an underlying insulator, and then using the insulator spots as a mask for creating the storage node topography.

This invention will describe another alternative for increasing the surface area of a polysilicon storage node electrode, by creating a grated, top surface topography, exhibiting a pattern of raised and lowered features in the polysilicon storage node. This grated, top surface topography is obtained via a process of initially depositing small diameter hemi-spherical grained, (HSG), spots, on a thin layer of silicon nitride, which in turn overlies a polysilicon layer, with the polysilicon layer to be used as the material for creation of the storage node electrode of a DRAM device. In this invention the small diameter HSG polysilicon spots, are oxidized to form silicon oxide spots, larger in diameter then the small diameter hemi-spherical polysilicon spots, and featuring smaller spaces between masking spots, then similar features described in the Lu invention. A dry etching procedure is then employed to transfer the image of the silicon oxide spots to the underlying thin silicon nitride layer, and into the polysilicon layer. The polysilicon layer now exhibits a grated, top surface topography, comprised of raised regions, regions protected by silicon oxide spots during the dry etch procedure, and lower regions, regions in which polysilicon was removed during the dry etching procedure. This invention, using only the silicon oxide spots as a mask for creation of the grated, top surface topography, of a storage node electrode, simplifies the Lu invention, in which an intermediate layer, of small diameter insulator spots, obtained from overlying HSG polysiliocn spots, was needed for the formation of an underlying polysilicon layer, with increased topography.

SUMMARY OF THE INVENTION

It is an object of this invention to create a DRAM device, with an STC structure, in which the surface area of the storage node electrode, of the STC structure is increased via use of a grated, top surface topography, in the storage node electrode.

It is another object of this invention to deposit a small diameter HSG polysilicon spots, on an underlying thin silicon nitride layer, which in turn overlies a polysilicon layer, followed by complete oxidation of the small diameter HSG polysilicon spots, creating silicon oxide spots, on the thin silicon nitride layer.

It is yet another object of this invention to use the silicon oxide spots as a mask to etch the exposed, thin silicon nitride layer, and the exposed polysilicon layer, to create a grated, top surface topography in the doped polysilicon layer, comprised of raised, unetched features, and lower, etched features.

It is still another object of this invention to pattern the polysilicon layer, with the grated, top surface topography, to create a storage node electrode, for an STC of a DRAM device, with increased capacitance of the STC structure resulting from the increased surface area of the grated, top surface topography, of the polysilicon layer.

In accordance with the present invention a method for fabricating increased capacitance DRAM devices, via use of an STC structure, comprised of a polysilicon storage node electrode with increased surface area, has been developed. A transfer gate transistor comprised of: a thin gate insulator; a polysilicon gate structure, formed from a first polysilicon layer; lightly doped source and drain regions; insulator spacers on the sidewalls of the polysilicon gate structure; and heavily doped source and drain regions; are formed on a semiconductor substrate. A composite insulator layer, comprised of a thin underlying silicon oxide layer, and a thick, overlying, doped oxide layer, is deposited, planarized, then followed by a contact hole opening in the composite insulator layer, made to expose the source and drain regions of adjacent transfer gate transistors. A second polysilicon layer is deposited, doped via use of in situ doping procedures, completely filling the contact hole opening, and contacting the source and drain regions of the transfer gate transistor. The second polysilicon layer also overlies the composite insulator layer, in regions outside the contact hole opening. A thin layer of silicon nitride is deposited on the underlying second polysilicon layer, followed by the deposition of a discontinuous layer of small diameter, HSG polysilicon spots. An oxidation procedure completely converts the small diameter HSG polysilicon spots to silicon oxide spots. An anisotropic reactive ion etch procedure is used, to etch the thin layer silicon nitride layer, exposed between silicon oxide spots, and to etch a top portion of second polysilicon layer, also exposed between the masking silicon oxide spots, creating a grated topography in the top surface of the second polysilicon layer, comprised of raised, unetched second polysilicon regions, and lower, etched second polysilicon regions. Removal of the silicon oxide spots, and the unetched silicon nitride, is followed by photolithographic and dry etching procedures, used to create the bottom electrode, or polysilicon storage node electrode shape, in the second polysilicon layer. A capacitor dielectric layer is next formed on the polysilicon storage node electrode structure, followed by the creation of an upper polysilicon electrode, or plate electrode structure, completing the processing of the STC structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM device, with increased capacitance, resulting from the use of a STC structure that features a polysilicon storage node electrode, with increased surface area resulting from a grated, top surface topography, will now be described. The transfer gate transistor, used for this DRAM device, in this invention, will be an N channel device. However the STC structure, with the increased surface area described in this invention, can also be applied to P channel, transfer gate transistor.

Figure 1:
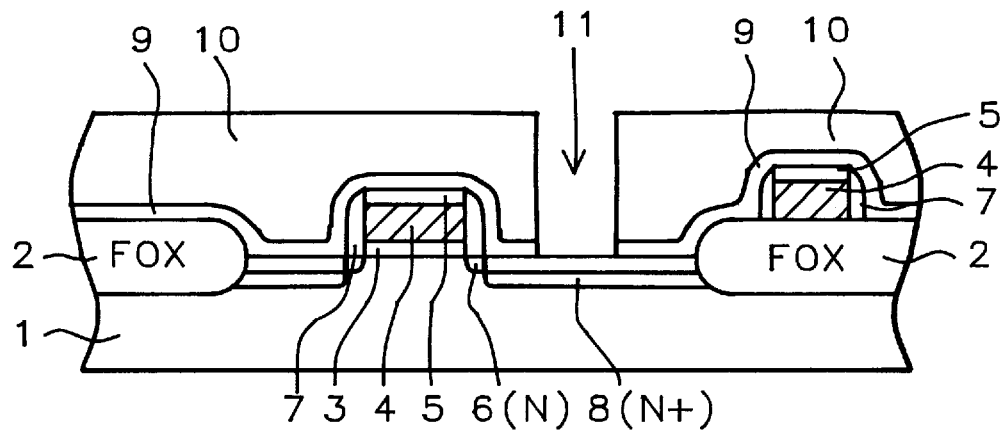
FIGS. 1–7, which schematically shows, in cross-sectional style, the key fabrication stages used in the creation of a DRAM device, with a STC structure, with an increased surface area, resulting from a polysilicon storage node electrode structure, featuring a grated, top surface topography.

Referring to FIG. 1, a P type, semiconductor substrate, 1, with a <100>, single crystalline orientation, is used. Field oxide, (FOX), regions, 2, are used for purposes of isolation. Briefly the FOX regions, 2, are formed via thermal oxidation, in an oxygen-steam ambient, at a temperature between about 850° to 1050° C., to a thickness between about 3000 to 5000 Angstroms. A patterned oxidation resistant mask of silicon nitride-silicon oxide is used to prevent FOX regions, 2, from growing on areas of substrate, 1, to be used for subsequent device regions. After the growth of the FOX regions, 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer, 3, of silicon oxide is thermally grown in an oxygen-steam ambient, at a temperature between about 850° to 1050° C., to a thickness between about 50 to 200 Angstroms. A first polysilicon layer, 4, is next deposited using low pressure chemical vapor deposition, (LPCVD), procedures, at a temperature between about 500° to 700° C., to a thickness between about 1500 to 4000 Angstroms. The polysilicon can either be grown intrinsically and doped via ion implantation of arsenic or phosphorous, at an energy between about 30 to 80 KeV, at a dose between about 1E13 to 1E16 atoms/cm$^2$, or grown using in situ doping procedures, via the incorporation of either arsine or phosphine to the silane ambient. A first silicon oxide layer, 5, used as a cap insulator layer, is next grown via the use of either LPCVD or plasma enhanced chemical vapor deposition, (PECVD), procedures, to a thickness between about 600 to 1500 Angstroms.

Conventional photolithographic and reactive ion etching, (RIE), procedures, using $CHF_3$ as an etchant for silicon oxide layer, 5, and using $Cl_2$ as an etchant for polysilicon layer, 4, are used to create polysilicon gate structures, 4, with overlying cap insulator layer, 5, shown schematically in FIG. 1. Photoresist removal is accomplished via plasma oxygen ashing and careful wet cleans.

A lightly doped source and drain region, 6, is next formed via ion implantation of phosphorous, at an energy between about 20 to 50 KeV, at a dose between about 1E13 to 1E14 atoms/cm$^2$. A second insulator layer of silicon oxide is then deposited using either LPCVD or PECVD procedures, at a temperature between about 400° to 700° C., to a thickness between about 1500 to 4000 Angstroms, followed by an anisotropic RIE procedure, using $CHF_3$ as an etchant, creating insulator spacer, 7, on the sidewalls of polysilicon gate structures, 4. A heavily doped source and drain region, 8, is then formed via ion implantation of arsenic, at an energy between about 30 to 100 KeV, at a dose between about 1E14 to 5E16 atoms/cm$^2$. The result of these procedures are schematically shown in FIG. 1.

A third insulator layer of undoped silicon oxide, 9, is next deposited using LPCVD or PECVD procedures, at a temperature between about 700° to 750° C., to a thickness between about 1000 to 1500 Angstroms. A layer of doped silicon oxide, 10, either boro-phosphosilicate glass, (BPSG), or phosphosilicate glass, (PSG), is next deposited, using PECVD procedures, at a temperature between about 600° to 800° C., to a thickness between about 3000 to 6000 Angstroms, using tetraethylorthosilicate, (TEOS) as a source with the addition of either diborane and phosphine, for the BPSG layer, or the addition of only phosphine, for the PSG layer. (Insulator layer 9, and insulator 10, can be replaced by a single doped, or undoped insulator layer, if desired). Doped oxide layer, 10, is planarized using chemical mechanical polishing, to provide a smoother surface for subsequent depositions and patterning procedures. The result of these depositions and planarization procedures are again schematically shown in FIG. 1. Conventional photolithographic and RIE procedures, using $CHF_3$ as an etchant, are used to open contact hole, 11, in doped silicon oxide layer 10, and in silicon oxide layer, 9, exposing the top surface of heavily doped source and drain region, 8, again shown schematically in FIG. 1. Photoresist removal is performed via use of plasma oxygen ashing and careful wet cleans.

Figure 2:
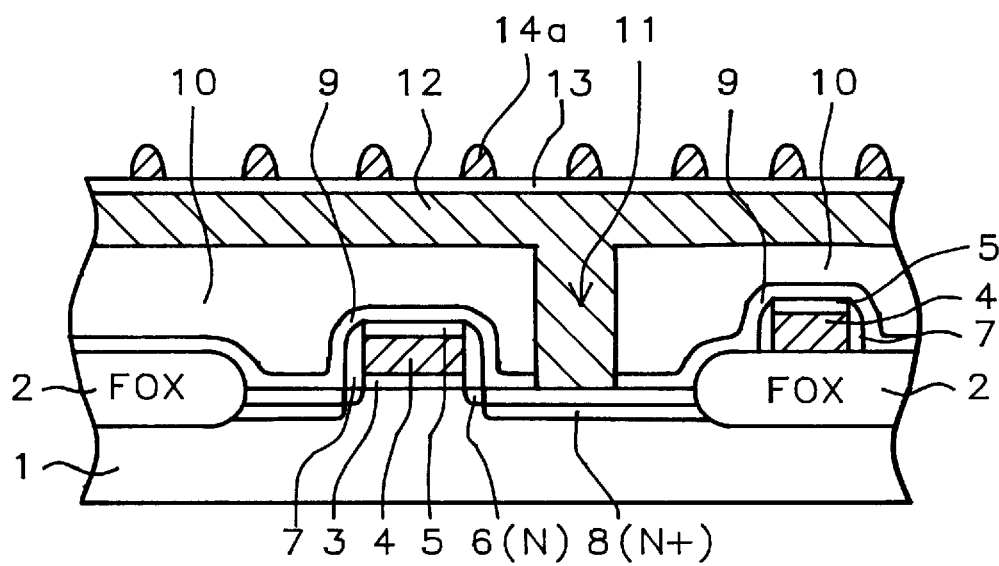

A second layer of polysilicon layer, 12, is next deposited, via LPCVD procedures, at a temperature between about 500° to 700° C., to a thickness between about 2000 to 6000 Angstroms. Polysilicon layer, 12, can be deposited intrinsically and doped via ion implantation of either phosphorous or arsenic, or polysilicon layer, 12, can be deposited using in situ doping procedures, via the addition of either phosphine or arsine, to a silane ambient. For both doping procedures polysilicon layer, 12, has an N type doping concentration of between 1E20 to 1E21 atoms/cm$^3$. Polysilicon layer, 12, shown schematically in FIG. 2, completely fills contact hole, 11, contacting underlying heavily doped source and drain regions, 8, of the underlying transfer gate transistor. Next a thin layer of silicon nitride, 13, is deposited using either LPCVD or PECVD procedures, at a temperature between about 600° to 700° C., to a thickness between about 300 to 800 Angstroms. A critical deposition of intrinsic, hemispherical grained, (HSG), polysilicon, 14a, is next deposited, on silicon nitride layer, 13, at a temperature between about 500° to 700° C., to a thickness in which the intrinsic HSG polysilicon is discontinuous, resulting in small diameter HSG polysilicon spots, 14a, between about 100 to 1000 Angstroms in thickness, with a diameter between about 50 to 500 Angstroms, and with a space between small diameter HSG polysilicon spots, 14a, between about 100 to 1000 Angstroms. This is shown schematically in FIG. 2. Another alternative is to use dots of single crystalline silicon, comprised of with similar thickness and diameter as the HSG polysilicon spots, 14a, in place of the HSG polysilicon spots, 14a.

Figure 3:
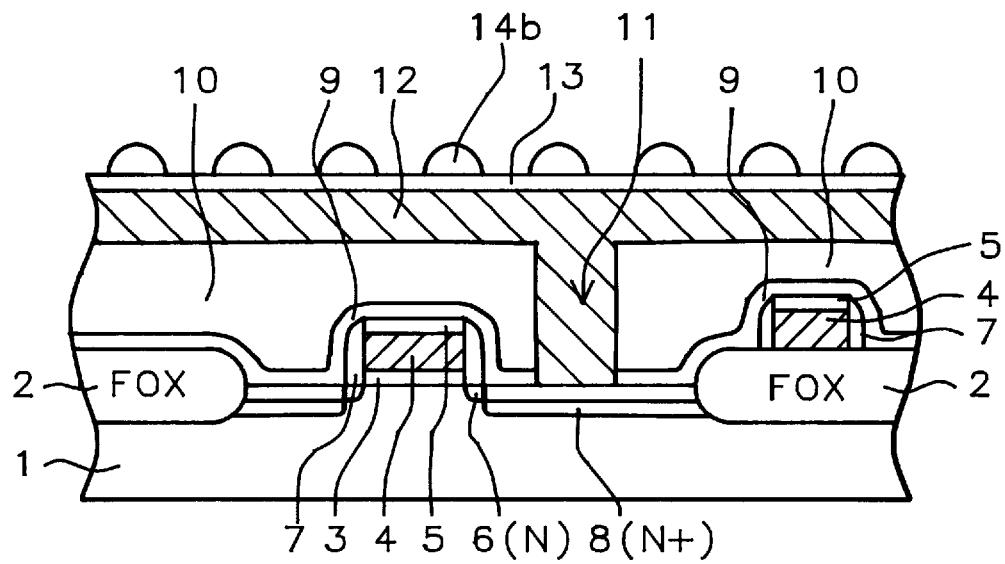

An oxidation procedure, performed in an oxygen-steam ambient, at a temperature between about 700° to 900° C., is next performed to completely convert small diameter HSG polysilicon spots, 14a, to silicon oxide spots, 14b. (Another alternative is to form only an silicon oxide layer, on the HSG polysilicon spots, 14a, not completely converting to silicon oxide). Silicon oxide spots, 14b, are between about 200 to 1000 Angstroms in thickness, with a diameter, larger then the diameter of the small diameter HSG polysilicon spots, 14a. Thin silicon nitride layer, 13, exposed between small diameter HSG polysilicon spots, 14a, protects underlying second polysilicon layer, 12, from the oxidation procedure. The result of this oxidation procedure, wherein the HSG polysilicon spots, 14a, are completely converted to silicon oxide spots, 14b, is schematically shown in FIG. 3.

Figure 4:
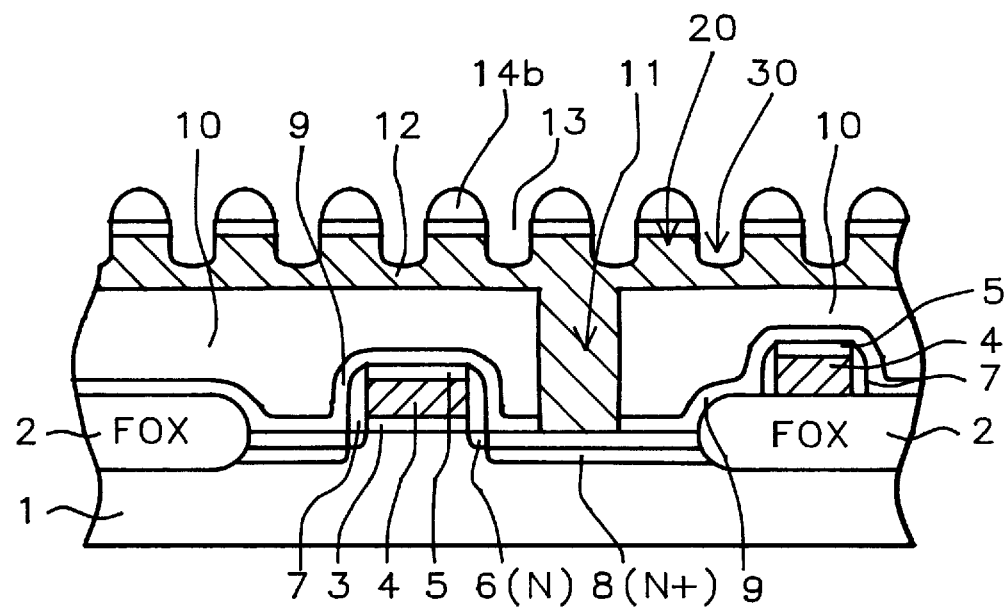
Figure 5:
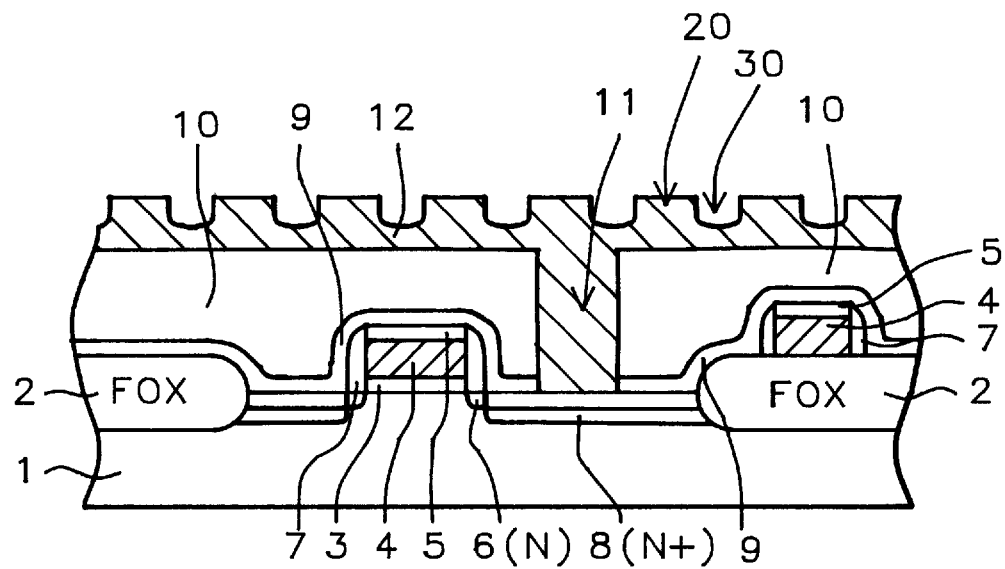

A critical reactive ion etching, (RIE), procedure is next performed using $Cl_2$ as an etchant, using silicon oxide spots, 14b, as a mask. The RIE procedures completely removes thin silicon nitride layer, 13, exposed between silicon oxide spots, 14b, and continues removing exposed second polysilicon layer, 12, shown schematically in FIG. 4. Polysilicon layer, 12, now features a grated, top surface topography, comprised of raised, unetched features, 20, and lower, etched features, 30, with the lower, etched features, 30, being between about 1000 to 5000 Angstroms below the top surface of raised, unetched features, 20. The rounded corners of the lower, etched features, 30, result from the conditions used in the chemical dry etch procedure used to transfer the image of silicon oxide spots, 14b, to the polysilicon layer, 12. The masking silicon oxide spots, 14b, are next removed via a buffered hydrofluoric acid solution, while regions of remaining, thin silicon nitride layer, 13, are removed using a hot phosphoric acid solution. The resulting second polysilicon layer, 12, with a grated, top surface topography, is schematically show in FIG. 5.

Figure 6:
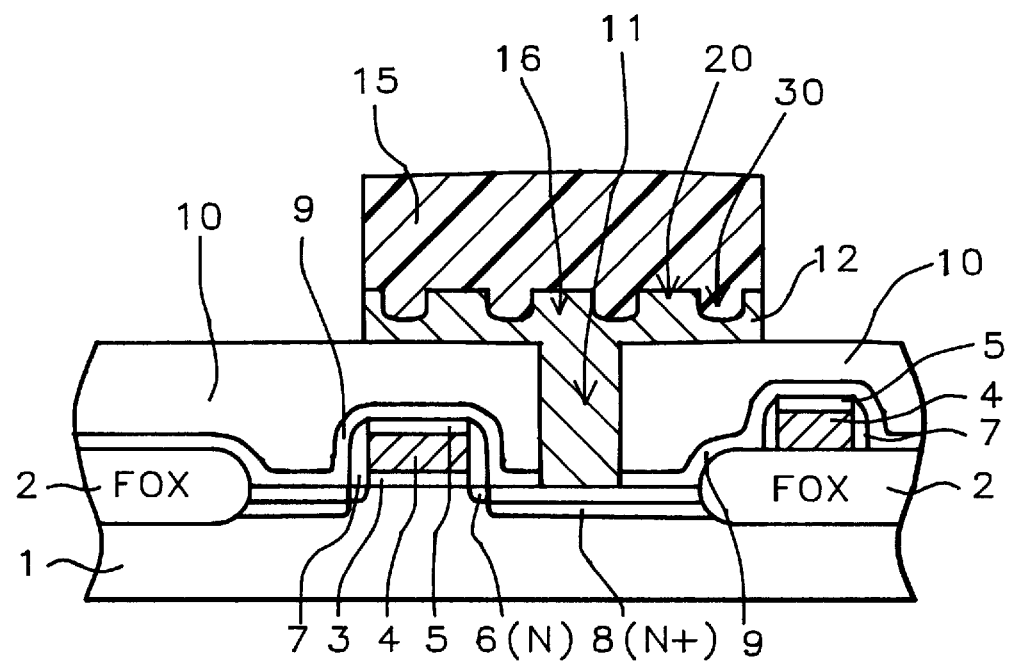

FIG. 6, schematically shows the patterning of second polysilicon layer, 12, featuring a grated, top surface topography. Photoresist shape, 15, is used as a mask, during a RIE procedure, using $Cl_2$ as an etchant, used to define polysilicon storage node electrode, 16. Polysilicon storage node electrode, 16, offers increased surface area, obtained via use of the grated, top surface topography, of second polysilicon layer, 12. Removal of photoresist shape, 15, is accomplished via plasma oxygen ashing, and careful wet cleans.

Figure 7:
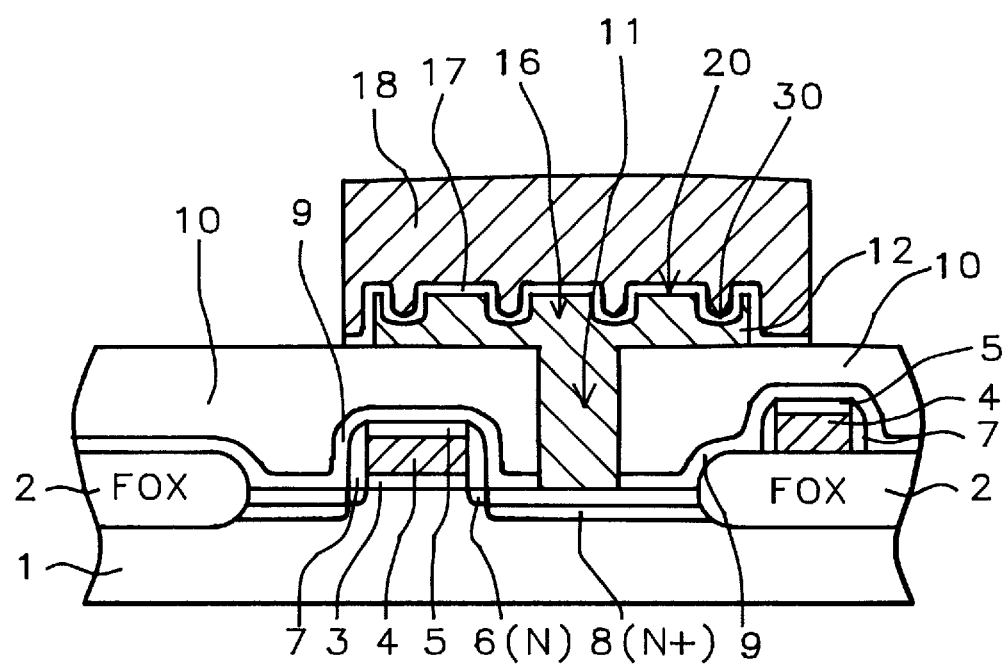

FIG. 7, schematically shows the completion of the STC structure. First a dielectric layer, 17, is formed, overlying the polysilicon storage node electrode, 16. Dielectric layer, 17, can be an insulator layer possessing a high dielectric constant, such as $Ta_2O_5$, obtained via r.f sputtering techniques, at a thickness between about 10 to 100 Angstroms. Dielectric layer, 17, can also be ONO, (Oxidized—silicon Nitride—silicon Oxide). The ONO layer is formed by initially growing a silicon dioxide layer, between about 10 to 50 Angstroms, followed by the deposition of a silicon nitride layer, between about 10 to 20 Angstroms. Subsequent thermal oxidation of the silicon nitride layer results in the formation of a silicon oxynitride layer on silicon oxide, at a silicon oxide equivalent thickness of between about 40 to 80 Angstroms. Finally another layer of polysilicon is deposited, via LPCVD procedures, at a temperature between about 500° to 700° C., to a thickness between about 1000 to 2000 Angstroms. Doping of this polysilicon layer is accomplished via an situ doping deposition procedure, by the addition of phosphine, to the silane ambient. Photolithographic and RIE procedures, using $Cl_2$ as an etchant, are next employed to create polysilicon upper electrode, or plate electrode, 18, shown schematically in FIG. 5. Photoresist is again removed via plasma oxygen ashing and careful wet cleans, resulting in STC structure, 18, featuring increased surface area of polysilicon storage node electrode, 15.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a dynamic random access memory (DRAM) device, on a semiconductor substrate, comprised of an underlying transistor; with a gate insulator, a gate electrode structure, formed from a first insulator layer, and from a first polysilicon layer, insulator sidewall spacers, formed from a second insulator layer, and source and drain regions, and an overlying stacked capacitor (STC), structure; with a polysilicon storage node electrode, a capacitor dielectric layer, and an overlying polysilicon plate electrode, and with said polysilicon storage node electrode, exhibiting a grated, top surface topography, comprising the steps of:

depositing a third insulator layer, on said underlying transistor of said DRAM device;

depositing a doped dielectric layer on said third insulator layer;

planarizing said doped dielectric layer;

opening a contact hole, in said doped dielectric layer, and in said third insulator layer, to expose top surface of said source and drain regions, of said underlying transistor;

depositing a second polysilicon layer on top surface of said doped dielectric layer, and on top surface of said source and drain regions, exposed in said contact hole;

depositing a thin silicon nitride layer, on underlying said second polysilicon layer;

depositing a layer, comprised of discontinuous, small diameter hemispherical grained (HSG), polysilicon spots on said thin silicon nitride layer, with the thickness of each small diameter HSG polysilicon spot between about 100 to 1000 Angstroms, and with the diameter of said small diameter HSG polysilicon spot between about 50 to 500 Angstroms, and with the space between said small diameter HSG polysilicon spots, between about 100 to 1000 Angstroms;

oxidizing to convert said small diameter HSG polysilicon spots, to silicon oxide spots, on underlying said thin silicon nitride layer;

anisotropic etching, using said silicon oxide spots as a mask, to remove said thin silicon nitride layer, from regions exposed between said silicon oxide spots, exposing top surface of said second polysilicon layer, and leaving regions of unetched thin silicon nitride layer, underlying said silicon oxide spots;

anisotropic etching of a top portion said second polysilicon layer, exposed between said silicon oxide spots, and between unetched regions of said thin silicon nitride layer, creating said grated, top surface topography, for said second polysilicon layer, comprised of raised, unetched features of said second polysilicon layer, in regions underlying said silicon oxide spots and unetched regions of said thin silicon nitride layer, and lower etched features, of a bottom portion of said second polysilicon layer, located between said raised, unetched features of said second polysilicon layer;

removing said silicon oxide spots;

removing unetched regions of said thin silicon nitride layer;

patterning of said second polysilicon layer, to create said polysilicon storage node electrode, with grated, top surface topography;

forming said capacitor dielectric layer on said polysilicon storage node electrode;

depositing a third polysilicon layer on said capacitor dielectric layer; and patterning of said third polysilicon layer to form said plate electrode, of said STC structure.

2. The method of claim 1, wherein said second polysilicon layer is deposited using low pressure chemical vapor desposition (LPCVD) procedures, at a temperature between about 500° to 700° C., to a thickness between about 2000 to 6000 Angstroms, with a N type dopant concentration between about 1E20 to 1E21 atoms/cm$^3$, obtained using in situ doping procedures, via the addition of phosphine or arsine to a silane ambient.

3. The method of claim 1, wherein said thin silicon nitride layer is deposited using LPCVD or plasma enhanced chemical vapor desposition (PECVD) procedures, at a temperature between about 600° to 700° C., to a thickness between about 300 to 800 Angstroms.

4. The method of claim 1, wherein said small diameter HSG polysilicon spots are deposited at a temperature between about 500° to 700° C.

5. The method of claim 1, wherein said oxidation, used to completely convert said small diameter HSG polysilicon spots to said silicon oxide spots, is performed in an oxygen—steam ambient, at a temperature between about 700° to 900° C.

6. The method of claim 1, wherein said silicon oxide spots are between about 200 to 1000 Angstroms in thickness.

7. The method of claim 1, wherein said anisotropic etching of said thin silicon nitride layer, exposed between said silicon oxide spots, is performed via RIE procedures, using $Cl_2$ as an etchant.

8. The method of claim 1, wherein said anisotropic etching of a top portion of said second polysilicon layer, exposed between said silicon oxide spots, is performed via RIE procedures, using $Cl_2$ as an etchant, removing between about 1000 to 5000 Angstroms of said second polysilicon layer, exposing top surface of said bottom portion of said second polysilicon layer.

9. The method of claim 1, wherein said grated, top surface topography, of said second polysilicon layer, is comprised of raised features of unetched, said second polysilicon layer, and lower features of said bottom portion, of said second polysilicon layer, located between said raised features, with the difference in height between said raised features, and said lower features, between about 1000 to 5000 Angstroms.

10. The method of claim 1, wherein said capacitor dielectric layer is oxidized, silicon nitride-silicon oxide (ONO), at an equivalent silicon dioxide thickness between about 40 to 80 Angstroms, created by an initial thermal oxidation to form a silicon oxide layer, between about 10 to 50 Angstroms, followed by a deposition of silicon nitride, to a thickness between about 10 to 20 Angstroms, and thermal oxidation of said silicon nitride layer, creating a silicon oxynitride layer, on the underlying, said silicon oxide layer.

11. The method of claim 1, wherein said third polysilicon layer, used for creation of said polysilicon plate electrode of said STC structure, is deposited using LPCVD procedures, at a temperature between about 500° to 700° C., to a thickness between about 1000 to 2000 Angstroms.

12. A method of fabricating a stacked capacitor structure, (STC), for a dynamic random access memory, (DRAM) device, in which the surface area of the polysilicon storage node electrode is increased by creating a grated, top surface topography in a polysilicon layer, used for said polysilicon storage node electrode, obtained via anisotropic etching of regions of said polysilicon layer, creating lower features of said grated, top surface topography, while using oxidized hemispherical grain, (HSG) polysilicon spots as a mask, to allow unetched, raised features of said grated, top surface topography, to remain in other regions of said polysilicon layer, comprising the steps of:

depositing a first insulator layer on an underlying transistor structure, of said DRAM device;

depositing a doped dielectric layer on said first insulator layer;

planarizing said doped dielectric layer;

opening a contact hole in said doped dielectric layer, and in said first insulator layer, to expose top surface of said underlying transistor region;

depositing a first polysilicon layer on top surface of said doped dielectric layer, and on said top surface of said underlying transistor region, exposed in said contact hole;

depositing a thin silicon nitride layer, on underlying said first polysilicon layer;

depositing a layer, comprised of discontinuous, small diameter HSG polysilicon spots on said thin silicon nitride layer, with each small diameter HSG polysilicon spot, at a thickness between about 100 to 1000 Angstroms, and with a diameter between about 50 to 500 Angstroms, and with a space between said small diameter HSG polysilicon spots, between about 100 to 1000 Angstroms;

oxidizing said small diameter HSG polysilicon spots to form silicon oxide spots;

anisotropic etching of said thin silicon nitride layer, exposed between said silicon oxide spots, exposing top surface of said first polysilicon layer, leaving unetched regions of said thin silicon nitride layer, underlying said silicon oxide spots;

anisotropic etching of a top portion of said first polysilicon layer, exposed between said silicon oxide spots, creating lower, etched features, for said grated, top surface topography, of said first polysilicon layer, while leaving raised, unetched features, for said grated, top surface topography, of said first polysilicon, in regions underlying said silicon oxide spots and underlying unetched regions, of said thin silicon nitride layer;

removing said silicon oxide spots;

removing unetched regions of said thin silicon nitride layer;

patterning of said first polysilicon layer to create said polysilicon storage node electrode, with said grated, top surface topography;

forming a dielectric layer on said polysilicon storage node electrode;

depositing a second polysilicon layer on said dielectric layer; and patterning of said second polysilicon layer to form polysilicon plate electrode, of said STC structure.

13. The method of claim 12, wherein said first polysilicon layer is obtained via LPCVD procedures, at a temperature between about 500° to 700° C., to a thickness between about 2000 to 6000 Angstroms, with an N type dopant concentration between about 1E20 to 1E21 atoms/cm$^3$, obtained using an in situ doping procedure via the addition of either phosphine or arsine to a silane ambient.

14. The method of claim 12, wherein said thin silicon nitride layer is deposited using LPCVD or PECVD procedures, at a temperature between about 600° to 700° C., to a thickness between about 300 to 800 Angstroms.

15. The method of claim 12, wherein said small diameter HSG polysilicon spots are deposited at a temperature between about 500° to 700° C.

16. The method of claim 12, wherein said oxidation, used to completely convert said small diameter HSG polysilicon spots, to said silicon oxide spots, is performed in an oxygen—steam ambient, at a temperature between about 700° to 900° C.

17. The method of claim 12, wherein said silicon oxide spots are between about 200 to 1000 Angstroms in thickness.

18. The method of claim 12, wherein said anisotropic RIE of said thin silicon nitride layer, exposed between said silicon oxide spots, is performed via RIE procedures, using $Cl_2$ as an etchant.

19. The method of claim 12, wherein said anisotropic etching of a top portion of said first polysilicon layer, exposed between said silicon oxide spots, is performed via RIE procedures, using $Cl_2$ as an etchant, removing between about 1000 to 5000 Angstroms of a top portion of said first polysilicon layer.

20. The method of claim 12, wherein said grated, top surface topography, of said first polysilicon layer, is comprised of raised, unetched features, and of lower, etched features, with said lower etched features located between said raised unetched features, and with the difference in height between said raised, unetched features, and said lower, etched features, being between about 1000 to 5000 Angstroms.

21. The method of claim 12, wherein said capacitor dielectric layer is ONO, with an equivalent silicon oxide thickness between about 40 to 80 Angstroms, created by growing a thin silicon oxide layer on said storage node electrode, at a thickness between about 10 to 50 Angstroms, depositing between about 10 to 20 Angstroms of a silicon nitride layer, and oxidizing said silicon nitride layer to from a silicon oxynitride layer on said thin silicon oxide layer.

22. The method of claim 12, wherein said second polysilicon layer is deposited using LPCVD procedures, at a temperature between about 500° to 700° C., to a thickness between about 1000 to 2000 Angstroms.

23. The method of claim 12, wherein said polysilicon plate electrode is created via RIE of said second polysilicon layer, using $Cl_2$ as an etchant.

* * * * *